United States Patent
Santarossa

(10) Patent No.: US 8,890,839 B2
(45) Date of Patent: Nov. 18, 2014

(54) CAPACITIVE PROXIMITY SWITCH

(75) Inventor: Bruno Santarossa, Limeshain (DE)

(73) Assignee: Continental Automotive GmbH, Hannover (DE)

( * ) Notice: Subject to any disclaimer, the term of this patent is extended or adjusted under 35 U.S.C. 154(b) by 209 days.

(21) Appl. No.: 13/640,269

(22) PCT Filed: Mar. 29, 2011

(86) PCT No.: PCT/EP2011/054822
§ 371 (c)(1),
(2), (4) Date: Oct. 9, 2012

(87) PCT Pub. No.: WO2011/124507
PCT Pub. Date: Oct. 13, 2011

(65) Prior Publication Data
US 2013/0027349 A1    Jan. 31, 2013

(30) Foreign Application Priority Data
Apr. 6, 2010   (DE) .......................... 10 2010 013 947

(51) Int. Cl.
*G06F 3/044*   (2006.01)
*H03K 17/955*   (2006.01)
*H03K 17/96*   (2006.01)

(52) U.S. Cl.
CPC .... *H03K 17/955* (2013.01); *H03K 2217/96079* (2013.01); *H03K 17/962* (2013.01); *H03K 2217/960785* (2013.01); *H03K 2217/960755* (2013.01)
USPC .......................................... 345/174; 361/752

(58) Field of Classification Search
None
See application file for complete search history.

(56) References Cited

U.S. PATENT DOCUMENTS

| | | | |
|---|---|---|---|
| 5,880,538 A | 3/1999 | Schulz | |
| 7,834,287 B2 | 11/2010 | Heiman et al. | |
| 2002/0167704 A1 | 11/2002 | Kleinhans et al. | |
| 2006/0131159 A1 | 6/2006 | Kaps et al. | |
| 2006/0238513 A1 | 10/2006 | Philipp | |
| 2008/0012734 A1 | 1/2008 | Ciechanowiski et al. | |
| 2009/0115645 A1 | 5/2009 | Roth | |
| 2009/0322709 A1 | 12/2009 | Lee et al. | |
| 2012/0217147 A1* | 8/2012 | Porter et al. | ................. 200/600 |

FOREIGN PATENT DOCUMENTS

| | | |
|---|---|---|
| CN | 1964192 | 5/2007 |
| DE | 201 19 700 U1 | 2/2002 |
| DE | 101 23 633 A1 | 2/2003 |
| DE | 20 2005 007 480 U1 | 7/2005 |
| DE | 10 2004 060 846 A1 | 6/2006 |
| DE | 20 2006 017 603 U1 | 3/2007 |

(Continued)

*Primary Examiner* — Joseph Haley
(74) *Attorney, Agent, or Firm* — Cozen O'Connor

(57) ABSTRACT

A capacitive proximity switch having a display panel including a translucent region. A first circuit board is translucent to light at least in the region of the translucent region of the display panel and supports capacitance-forming sensor layers. Light wells enclose the sensor layers on the side facing away from the observer, and protrude from the first circuit board to a second circuit board parallel to the first circuit board. Light sources are disposed within the light wells. A contact element leads from the first circuit board to the second circuit board. Optical fibers are applied on the first circuit board in the region of the translucent region. The first circuit board is encapsulated by an opaque plastic functional carrier. An opaque decorative layer covers the observer side of the optical fibers and the functional carrier, and includes characters and/or symbols in the region of the translucent region.

10 Claims, 2 Drawing Sheets

(56) References Cited

FOREIGN PATENT DOCUMENTS

| | | |
|---|---|---|
| DE | 10 2006 022 965 A1 | 11/2007 |
| DE | 10 2006 039 133 | 3/2008 |
| DE | 10 2007 004 889 A1 | 8/2008 |
| DE | 10 2008 029 567 | 1/2010 |
| DE | 10 2008 029 567 A1 | 1/2010 |
| EP | 1 672 797 | 6/2006 |
| EP | 1 672 797 A2 | 6/2006 |
| EP | 2 141 808 | 1/2010 |
| EP | 2 141 808 A2 | 1/2010 |
| WO | 10 2006 039 133 A1 | 3/2008 |
| WO | WO 2009/153161 | 12/2009 |

* cited by examiner

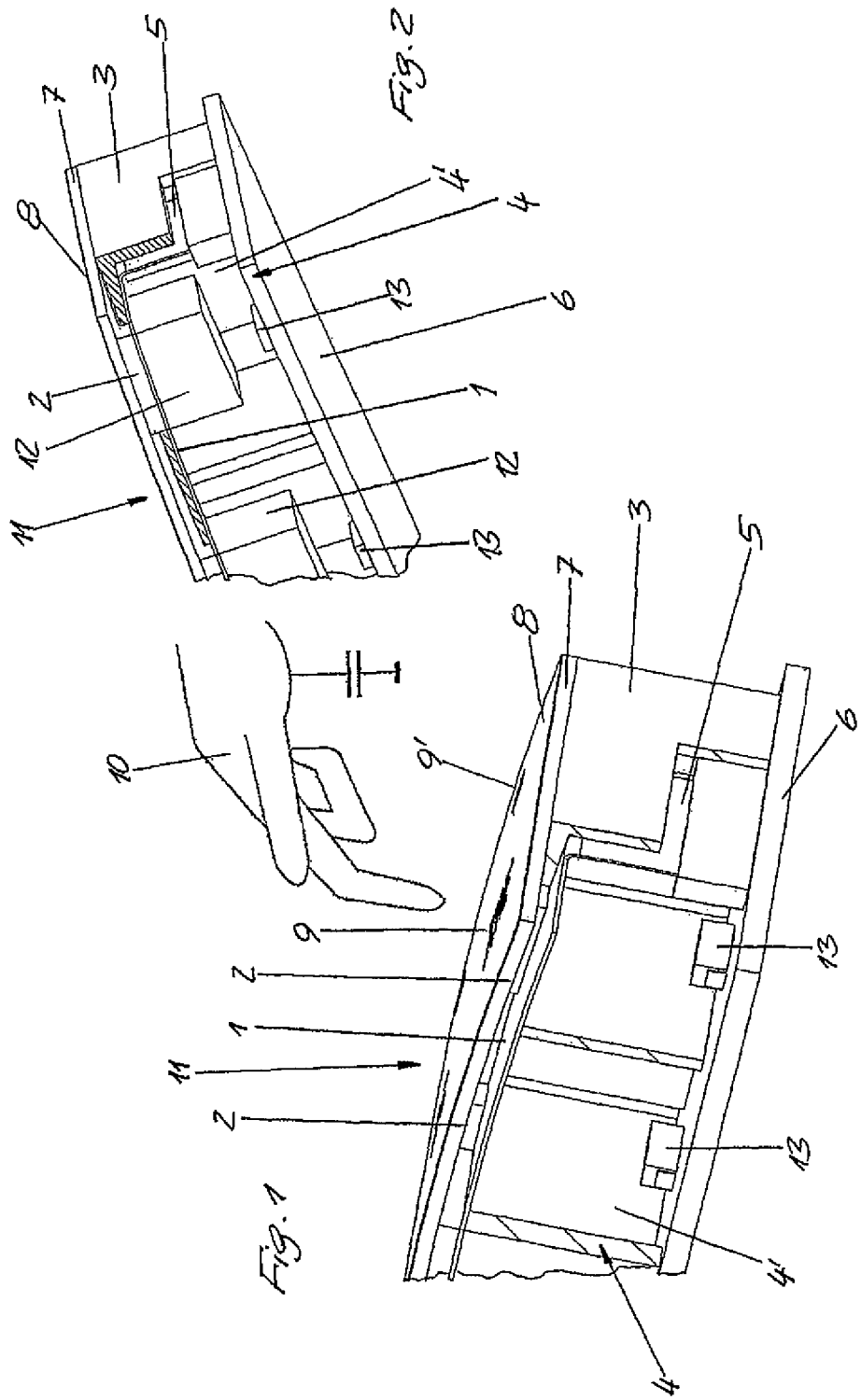

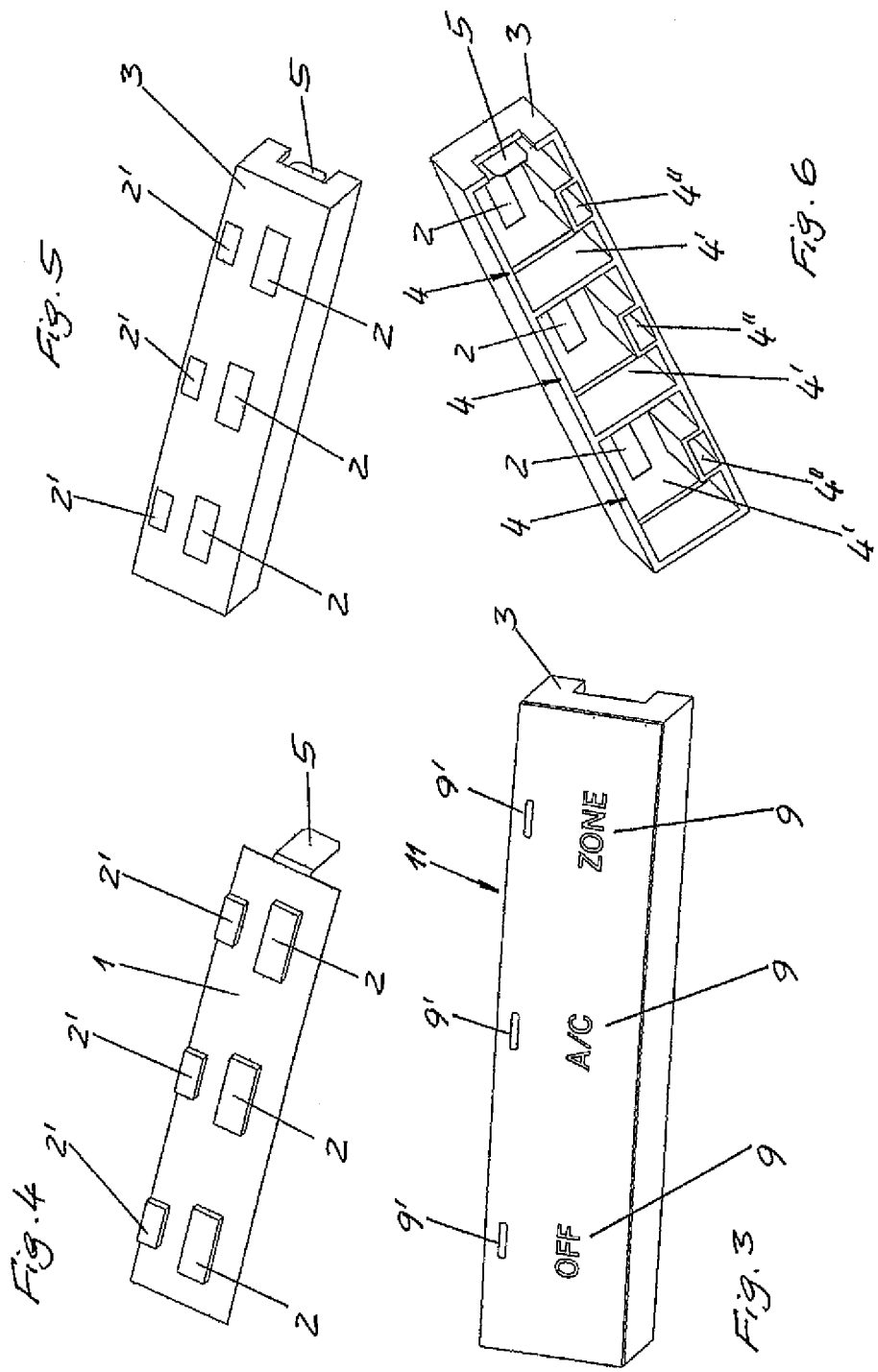

CAPACITIVE PROXIMITY SWITCH

CROSS REFERENCE TO RELATED APPLICATION

This is a U.S. national stage of application No. PCT/EP2011/054822, filed on 29 Mar. 2011. Priority is claimed on German Application No.: 10 2010 013 947.5 filed 6 Apr. 2010 the content of which is incorporated here by reference.

BACKGROUND OF THE INVENTION

1. Field of the Invention

The invention relates to a capacitive proximity sensor with a display field having one or more transparent regions and on whose side facing away from an observer a first printed circuit board is arranged, the printed circuit board being translucent at least in the region of the transparent regions of the display field and having capacitance-forming sensor layers, with light shafts that surround the sensor layers on the side facing away from the observer and project from the first printed circuit board to a second printed circuit board extending at a distance parallel to the first printed circuit board, light sources are arranged inside the light shafts on the second printed circuit board, and a contact element leading from the first printed circuit board to the second printed circuit board.

2. Description of Prior Art

Such capacitive proximity sensors are used to change the capacitance, when a person's hand approaches in particular, by evaluating the measurement signal by a control and evaluation unit.

The illuminable transparent regions of the display field are used to more easily find the sensor regions.

SUMMARY OF THE INVENTION

An object of one embodiment of the invention is to provide a capacitive proximity sensor that has a compact structure and can be produced in a simple and inexpensive manner, which has good sensitivity when an observer's hand approaches, and makes it possible to easily find the sensor regions.

According to one embodiment of the invention, optical waveguides are applied to the observer side of the first printed circuit board in the regions of the transparent regions and the first printed circuit board is encapsulated on the observer side by a functional carrier made of opaque plastic with the same thickness as the optical waveguides, omitting the regions of the optical waveguides on both sides of the first printed circuit board and forming the light shafts on the side facing away from the observer, with an opaque decorative layer that covers the optical waveguides and the functional carrier on the observer side and has apertures forming characters and/or symbols in the regions of the transparent regions, the second printed circuit board being fastened to that side of the functional carrier which faces away from the observer.

The illuminated regions in the immediate surroundings or even in the region of the sensor layers make it possible to easily find the sensor regions.

Since the sensor layers are close to that layer of the proximity sensor which is closest to the observer, a high degree of sensitivity when the observer's hand approaches is achieved.

As a result of injection-molding, only a few assembly steps are required when producing the proximity sensor.

The functional carrier produced by encapsulating the optical waveguides and the first printed circuit board performs a multiple function by virtue of the fact that it not only holds the optical waveguides and the first printed circuit board but also simultaneously forms the light shafts.

Furthermore, the functional carrier can also be used to fasten the second printed circuit board and possibly further elements, for example rotating actuators.

Apertures in the decorative layer may be produced in any suitable manner.

The apertures can be produced in a particularly simple and suitable manner by a laser method.

The light sources are preferably LEDs, which can be easily fitted as a result of a surface mount design, have only low heat generation, high durability, and low power consumption.

If the optical waveguides and the functional carrier are spray-coated on the observer side such that they are covered with a transparent plastic layer of film thickness, to which the decorative layer is applied, sink marks on the optical waveguides and the functional carrier and in the boundary regions between the optical waveguides and the functional carrier as well as height differences toward the observer side of the optical waveguides and the functional carrier are compensated for and a uniform plane toward the observer side is obtained.

In a particularly simple manner, the decorative layer may be a varnish layer.

If the first printed circuit board is a flexible printed circuit board, this results in a small installation space.

A flexible printed circuit board also makes it possible to deform the flexible first printed circuit board into a 3D contour, for example by deep-drawing, before arranging the optical waveguides and encapsulation by the functional carrier, with the result that the side of the functional carrier that faces the observer and thus the display field can also be given a 3D contour.

Furthermore, an extension of one end of the flexible printed circuit board may form the contact element leading to the second printed circuit board. So that the optical waveguides emit colored light, they may be transparent in one or more colors.

However, it is also possible to use colored light sources.

If the first printed circuit board is opaque and/or in order to achieve particularly low light loss, the first printed circuit board may have, in the regions of the transparent regions, continuous recesses that correspond to the continuous regions and are covered by the optical waveguides.

If second optical waveguides are applied to that side of the first printed circuit board that faces away from the observer in the regions of the transparent regions, this results in an increased luminous efficiency of the light produced by the light sources and guided toward the observer.

The second optical waveguides may preferably project through the light shafts largely up to the second printed circuit board.

The first optical waveguides and/or the second optical waveguides may be applied to the first printed circuit board in a simple manner by adhesive bonding or spraying-on.

In a component-saving manner, the first optical waveguides and second optical waveguides associated with one another may be formed in one part.

BRIEF DESCRIPTION OF THE DRAWINGS

Exemplary embodiments of the invention are illustrated in the drawing and are described in more detail below. In the drawing FIG. 1 is a perspective sectional view of a first exemplary embodiment of a capacitive proximity sensor;

FIG. 2 is a perspective sectional view of a second exemplary embodiment of a capacitive proximity sensor;

FIG. 3 is a perspective front view of a proximity sensor according to FIGS. 1 and 2 without a second printed circuit board;

FIG. 4 is a perspective view of a first printed circuit board of the proximity sensor according to FIG. 1;

FIG. 5 is a perspective front view of the proximity sensor according to FIG. 1 without a decorative layer and a second printed circuit board; and FIG. 6 is a perspective rear view of the proximity sensor according to FIG. 5.

DETAILED DESCRIPTION OF THE PREFERRED EMBODIMENTS

The proximity sensors illustrated have a first printed circuit board 1, which is in the form of a flexible printed circuit board, has conductor tracks (not illustrated) and capacitance-forming sensor layers.

The first printed circuit board 1 is transparent.

The sensor layers are likewise transparent and may be so-called ITO layers (indium-tin-oxide layers).

First optical waveguides 2 and further first optical waveguides 2' are applied to the printed circuit board 1, both to the sensor layers and at a distance beside the sensor layers, by spraying-on.

In the exemplary embodiment in FIG. 2, second optical waveguides 12 continue the first optical waveguides 2 on that side of the first printed circuit board 1 that faces away from the observer are applied to that side of the first printed circuit board 1 that faces away from the observer.

After the operation of applying the optical waveguides 2, 2', 12, the first printed circuit board 1 is inserted into an injection mold and is encapsulated with a box-like functional carrier 3 made of opaque plastic, the region of the first optical waveguides 2 and of the further first optical waveguides 2' on both sides of the first printed circuit board 1 being omitted and that region of the functional carrier 3 that covers the first printed circuit board 1 on the observer side having the same thickness as the first optical waveguides 2 and the further first optical waveguides 2'.

The functional carrier 3 forms light shafts 4 on that side of the first printed circuit board 1 that faces away from an observer. In this case, a light shaft 4 is assigned to each pair of first optical waveguides 2 and further first optical waveguides 2' which are assigned to a sensor layer.

The light shafts 4 are subdivided into first light shafts 4' and second light shafts 4", the first light shafts 4' lead to the first optical waveguides 2 arranged on the sensor layers and the second light shafts 4" lead to the further first optical waveguides 2' (FIG. 6).

An extension of the first printed circuit board 1, which forms a contact element 5, is bent out of the plane of the first printed circuit board 1 at right angles to the side facing away from the observer and is injected into the functional carrier 3, with the exception of its free end FIG. 4, 5).

On their side facing away from the observer, the light shafts 4 are closed by a common second printed circuit board 6, which is fastened to the functional carrier 3.

LEDs 13 are arranged in each light shaft 4' and 4" on this second printed circuit board 6, which is connected to the first printed circuit board 1 via the contact element 5.

On the observer side, the optical waveguides 2, 2' and the functional carrier 3 are spray-coated with a thin transparent plastic layer 7.

An opaque decorative layer 8 that may include a varnish layer is in turn applied to this plastic layer, thus forming a display field 11.

Apertures 9, 9' which form markings made of letters over the first optical waveguides 2 and form light bars over the further first optical waveguides 2' are produced over the first optical waveguides 2 and 2' by lasering the decorative layer 8 (FIG. 3).

The surface of the decorative layer 8 may also be covered by a transparent varnish for the purpose of protection.

If a finger of the observer's hand 10 approaches one of the markings made of letters on the display field 11, this changes the capacitance on the sensor layer associated with this marking, which change is detected and triggers a function on an electrical or electronic device via a control unit (not illustrated).

As a result of the driven LEDs, the apertures 9 are transilluminated via the first optical waveguides 2 and the apertures 9' are transilluminated via the further first optical waveguides 2'.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A capacitive proximity sensor comprising:
   a display field having at least one transparent region;
   a first printed circuit board arranged on a first side of the display field facing away from an observer, the first printed circuit board being translucent at least in a region corresponding to the at least one transparent region of the display field;
   a second printed circuit board arranged at a distance from the first printed circuit board and substantially parallel to the first printed circuit board;
   capacitance-forming sensor layers;
   light shafts arranged to surround the sensor layers on the side facing away from the observer and project between the first printed circuit board and the second printed circuit board;
   light sources arranged corresponding to the light shafts on the second printed circuit board;
   a contact element arranged from the first printed circuit board to the second printed circuit board;
   first optical waveguides applied to a side of the first printed circuit board facing the display field corresponding to the at least one transparent region of the display field;
   a functional opaque plastic carrier, having a same thickness as the first optical waveguides, that encapsulates the first side of the first printed circuit board, omitting regions corresponding to the first optical waveguides, and forms light shafts on a side of the carrier facing away from the observer; and an opaque decorative layer that covers the first optical waveguides and the functional carrier on the observer side defining apertures forming at least one of characters and symbols in the region corresponding to the transparent region of the display field, wherein the second printed circuit board is fastened to a side of the functional carrier that faces away from the observer.

2. The proximity sensor as claimed in claim 1, wherein the first optical waveguides and the functional carrier are spray-coated on the observer with a transparent plastic layer to which the opaque decorative layer is applied.

3. The proximity sensor as claimed in claim 2, wherein the opaque decorative layer is a varnish layer.

4. The proximity sensor as claimed in claim 1, wherein the first printed circuit board is a flexible printed circuit board.

5. The proximity sensor as claimed in claim 1, wherein the first optical waveguides are transparent in at least one color.

6. The proximity sensor as claimed in claim 1, wherein the first printed circuit board has continuous recesses corresponding to the transparent regions covered by the first optical waveguides.

7. The proximity sensor as claimed in claim 1, wherein second optical waveguides are applied to that side of the first printed circuit board, which faces away from the observer in a region corresponding to the transparent regions.

8. The proximity sensor as claimed in claim 7, wherein the second optical waveguides project through the light shafts largely up to the second printed circuit board.

9. The proximity sensor as claimed in claim 8, wherein at least one of the first optical waveguides and the second optical waveguides are applied to the first printed circuit board by one of adhesive bonding and spraying-on.

10. The proximity sensor as claimed in claim 7, wherein the first optical waveguides and the second optical waveguides are formed in one part.

\* \* \* \* \*